(12) United States Patent
Duffy et al.

(10) Patent No.: US 9,607,858 B2
(45) Date of Patent: Mar. 28, 2017

(54) LOW RESISTANCE CONTACTS FOR SEMICONDUCTOR DEVICES

(71) Applicants: Excico France, Gennevilliers (FR); University College Cork—National University of Ireland, Cork, Cork (IE)

(72) Inventors: Ray Duffy, Cork (IE); Maryam Shayesteh, Cork (IE); Karim Huet, Gennevilliers (FR)

(73) Assignees: Laser Systems & Solutions of Europe (LASSE) Screen Semiconductor Solutions Co. Ltd., Gennevillers (FR); University College Cork—National University of Ireland, Cork, Cork (IE)

( * ) Notice: Subject to any disclaimer, the term of this patent is extended or adjusted under 35 U.S.C. 154(b) by 0 days.

(21) Appl. No.: 14/764,606

(22) PCT Filed: Jan. 30, 2014

(86) PCT No.: PCT/EP2014/051782
§ 371 (c)(1),
(2) Date: Jul. 30, 2015

(87) PCT Pub. No.: WO2014/177288
PCT Pub. Date: Nov. 6, 2014

(65) Prior Publication Data
US 2015/0364561 A1    Dec. 17, 2015

Related U.S. Application Data

(60) Provisional application No. 61/758,716, filed on Jan. 30, 2013.

(30) Foreign Application Priority Data

Jan. 30, 2013 (EP) .................................. 13153312

(51) Int. Cl.
*H01L 23/52* (2006.01)
*H01L 21/324* (2006.01)
(Continued)

(52) U.S. Cl.
CPC ........ *H01L 21/3247* (2013.01); *H01L 21/268* (2013.01); *H01L 21/2855* (2013.01);
(Continued)

(58) Field of Classification Search
CPC ... H01L 21/268; H01L 29/16; H01L 21/2855; H01L 21/28568; H01L 21/324; H01L 29/45
(Continued)

(56) References Cited

U.S. PATENT DOCUMENTS 6,703,291 B1 *  3/2004  Boyanov ................... C23F 1/26
                                                    257/741
8,105,960 B2 *  1/2012  Doris ..................... B82Y 30/00
                                                    438/230
(Continued)

OTHER PUBLICATIONS

Dimoulas et al., "Fermi-level pinning and charge neutrality level in germanium", Applied Physics Letters 89, 252110 (2006), 3 pgs.
(Continued)

*Primary Examiner* — Luan C Thai
(74) *Attorney, Agent, or Firm* — K&L Gates LLP (57) ABSTRACT

The invention provides a method of forming at least one Metal Germanide contact on a substrate for providing a semiconducting device (100) by providing a first layer (120) of Germanium (Ge) and a second layer of metal. The invention provides a step of reacting the second layer with the first layer with high energy density pulses for obtaining a Germanide metal layer (160A) having a substantially planar interface with the underlying first (Ge) layer.

15 Claims, 10 Drawing Sheets

(51) Int. Cl.
H01L 21/268 (2006.01)
H01L 21/285 (2006.01)
H01L 29/78 (2006.01)
H01L 29/08 (2006.01)
H01L 29/16 (2006.01)
H01L 29/45 (2006.01)

(52) U.S. Cl.
CPC .. *H01L 21/28512* (2013.01); *H01L 21/28568* (2013.01); *H01L 21/324* (2013.01); *H01L 29/0847* (2013.01); *H01L 29/16* (2013.01); *H01L 29/45* (2013.01); *H01L 29/78* (2013.01)

(58) Field of Classification Search
USPC .......................................................... 257/766
See application file for complete search history.

(56) References Cited

U.S. PATENT DOCUMENTS

| | | | |
|---|---|---|---|
| 8,901,414 B2* | 12/2014 | Baker-O'Neal | H01L 31/02242 136/252 |
| 9,284,656 B2* | 3/2016 | Fisher | H01L 21/2885 |
| 2009/0146183 A1 | 6/2009 | Moon et al. | |
| 2010/0035399 A1 | 2/2010 | Rachmady et al. | |

OTHER PUBLICATIONS

Firrincieli et al., "Study of ohmic contacts to n-type Ge: Snowplow and laser activation", Applied Physics Letters 99, 242104 (2011), 3 pgs.

Gallacher et al., "Ohmic contacts to n-type germanium with low specific contact resistivity", Applied Physics Letters, 022113 (2012), 3 pgs.

Husain et al., "High-Quality Schottky Contacts for Limiting Leakage Curents in Ge-Based Schottky Barrier MOSFETs", IEEE Transactions on Electron Devices, 56(3):499-504, Mar. 2009.

Kang et al., "Thermally Robust Ni Germanide Technology Using Cosputtering of Ni and Pt for High-Performance nanoscale Ge MOSFETs", IEEE Transactions on Nanotechnology, 11(4):769-776, Jul. 2012.

Lee et al., "Formation and Morphology Evolution of Nickel Germanides on Ge (100) under Rapid Thermal Annealing", Mat. Res. Soc. Symp. Proc., 810:C2.4.1-C2.4.5, 2004.

Lim et al., "Fermi-level depinning at the metal-germanium interface by the formation of epitaxial nickel digermanide NiGe2 using pulsed laser anneal", Applied Physics Letters 101, 172103 (2012), 4 pgs.

Mazzocchi et al., "Boron and Phosphorus dopant activation in germanium using Laser annealing with and without preamorphization implant", 17th IEEE International Conference on Advanced Thermal Processing of Semiconductors—RTP 2009, 5 pgs.

Roy et al., "The Effect of Fixed Charge in Tunnel-Barrier Contacts for Fermi-Level Depinning in Germanium", IEEE Electron Device Letters, 33(6):761-763, Jun. 2012.

Shayesteh et al., "NiGe Contacts and Junction Architectures for P and As Doped Germanium Devices", IEEE Transactions on Electron Devices, 58(11):3801-3807, Nov. 2011.

Thareja et al., "High Performance Germanium N-MOSFET with Antimony Dopant Activation Beyond 1×1020 cm-3", IEEE International, 2010, 4 pgs.

Tong et al., "Selenium Segregation for Effective Schottky Barrier Height Reduction in NiGe/n-Ge Contacts", IEEE Electron Device Letters, 33(6):773-775, Jun. 2012.

Wu et al., "Impact of fluorine treatment on Fermi level depinning for metal/germanium Schottky junctions", Applied Physics Letters 99, 253504 (2011), 3 pgs.

Zhang et al., "Formation and Thermal Stability of Nickel Germanide on Germanium Substrate," Japanese Journal of Applied Physics, 44(45):L1389-L1391, 2005.

Zhou et al., "Investigating the origin of Fermi level pinning in Ge Schottky junctions using epitaxially grown ultrathin MgO films", Applied Physics Letters 96, 102103 (2010), 3 pgs.

PCT International Search Report for International Application No. PCT/EP2014/051782, date of mailing: Aug. 1, 2014, 4 pgs.

PCT Written Opinion of the International Searching Authority for International Application No. PCT/EP2014/051782, date of mailing: Aug. 1, 2014, 5 pgs.

PCT International Preliminary Report on Patentability for International Application No. PCT/EP2014/051782, date of Issuance: Aug. 4, 2015, 6 pgs.

* cited by examiner

LOW RESISTANCE CONTACTS FOR SEMICONDUCTOR DEVICES

CROSS REFERENCE TO RELATED APPLICATIONS

This is the national phase under 35 U.S.C. §371 of International Application No. PCT/EP2014/051782, filed on Jan. 30, 2014, which claims priority to and the benefit of European Patent Application No. 13153312.7, filed on Jan. 30, 2013 and U.S. Patent Application No. 61/758,716, filed on Jan. 30, 2013, the entire disclosures of each of which are incorporated by reference herein.

FIELD OF THE INVENTION

The present invention relates to improvements in low resistance contacts for semiconductor devices. In particular, the present invention relates to a method of providing semiconductor device transistors with improved low resistance contacts.

BACKGROUND OF THE INVENTION

Germanium (Ge) is a promising material for advanced semiconductor devices, because it provides much higher carrier mobilities than Silicon (Si). A remaining stumbling block to the association of Germanium (Ge) with production processes of advanced logic devices, is the high contact resistance to n-type Ge layers. The performance of Ge and III-V devices can be improved by reducing contact resistance and process variability. High resistance may arise from poor quality contacts, process variability can arise from rough or unintentionally textured surfaces.

An approach to create stable low resistive contacts is to form a metal-semiconductor alloy, such as NiGe, at the surface in combination with high doping concentrations underneath. Specifically in Ge, the n-type system has proven difficult because of the large electron Schottky barrier height (eSBH) and resulting high contact resistance ($\rho_c$), and surface states associated with dangling bonds at the Ge surface can lead to Fermi-Level Pinning (FLP) [1, 2]. This can affect metal/Ge contact behaviour, because the Fermi level is pinned close to the valence band.

Three of the most common n-type Ge contact solutions include (a) ultra-thin amorphous insulating layers to terminate the free dangling bonds and eliminate FLP, (b) surface passivation to bond other impurity species to the dangling Ge bonds at the surface, and (c) optimization of the metal-semiconductor alloy, such as NiGe, in combination with high active doping concentrations underneath to create stable low-resistive contacts. To form the metal/semiconductor alloy, Ni is deposited, and then an anneal is performed to react the Ni with the Ge. Typically a standard anneal (Rapid-Thermal-Anneal, or RTA) is applied. This results in a relatively rough interface between the NiGe layer and the Ge underneath. The NiGe material is poly-crystalline in nature so it is generally not planar.

Theoretical studies have shown that a thin insulating tunnel barrier can de-pin the Ge surface with optimum thicknesses of approximately 1 nm [4]. Selenium segregation was recently used to reduce eSBH for NiGe/n-Ge contacts [5], while $CF_4$ plasma treatment of the Ge surface was experimentally demonstrated to alleviate FLP [6]. Gallacher et al. extracted specific contact resistivity ($\rho_c$) of $2.3 \times 10^{-7}$ $\Omega \cdot cm^2$ on n-type Ge that was doped during epitaxial growth [7]. The optimum NiGe formation temperature was a 340° C. Rapid Thermal Anneal (RTA). However, the NiGe interface with the underlying substrate was not smooth.

Laser-Thermal-Annealing (LTA) techniques are of increasing interest in semiconductor processing, as it enables ultrafast annealing with very limited thermal budgets. It can suppress dopant diffusion and generates high levels of dopant activation. Specifically in Ge, Mazzocchi et al. reported high activation levels of B and P dopants ($>1 \times 10^{20}$ $cm^{-3}$) as well as limited diffusion when they used LTA with energy densities in the range of 0.57-1.8 $J/cm^2$ [8]. High quality $n^+/p$ junctions were also realized using LTA of Sb-doped Ge by Thareja et al. [9]. Furthermore, Firrincieli et al. reported $\rho_c$ of $8 \times 10^{-7}$ $\Omega \cdot cm^2$ on n-type Ge where LTA was used for dopant activation, in combination with RTA for NiGe formation [10]. The NiGe layers were thermally stable up to 350° C., but the interface with the Ge substrate was not flat. This is common for NiGe layers formed by RTA. Another example is disclosed in a paper by LIM P S Y et al entitled 'Fermi-level depinning at the metal-germanium interface by the formation of epitaxial nickel digermanide NiGe2 using pulsed laser anneal'—Applied Physics Letters American Institute of Physics USA, col. 101, no 17, 22 Oct. 2012.

An improved method of providing semiconductor devices with low resistance contacts is therefore required, which mitigates at least the above shortcomings of the prior art.

SUMMARY OF THE INVENTION

According to the invention there is provided, as set out in the appended claims, a method of forming at least one Metal Germanide contact on a substrate, for example a Germanium (Ge) or Silicon (Si) substrate, for providing a semiconducting device (100), comprising the steps of:
  providing a first layer (120) of Germanium (Ge);
  providing a second layer of metal; and
  reacting the second layer with the first layer with high energy density pulses for obtaining a Germanide metal layer (160A) having a substantially planar interface with the underlying first (Ge) layer.

In the context of the present invention the term 'substrate' should be afforded a broad definition. The substrate refers to the part of the wafer where integrated circuits and transistors and other semiconductor devices can be located. In other cases 'substrate' can refer to the entire thickness of the wafer. In one embodiment Germanium is likely to be integrated on top of Silicon wafers (used for mechanical strength), so in that sense the germanium can be described as a "layer".

In one embodiment the high energy density pulses are in the range 0.25 to 0.55 $J/cm^2$ and pulse durations generate a temperature of at least 800° C.

In one embodiment the inventors have used LTA for NiGe contact formation on n-type Ge substrates, and compared same systematically to results generated by conventional RTA with respect to surface topography, interface quality, crystal structure, material stoichiometry, specific contact resistivity, and thermal stability. Germanide layers formed by LTA are referred to herein as $Ni_xGe_y$, because it will be demonstrated that there are multiple stoichiometries present under processing conditions. It will be appreciated that one important advantage of using LTA with process conditions as claimed is that it allows annealing in ambient air thus simplifying the conditions for the overall process.

In one embodiment the metal comprises Nickel (Ni).

In one embodiment the metal comprises at least one of: Fe, Co, Ni, Pd, Pt, Cu or Yb.

In one embodiment the temperature generated is at least 900° C.

In one embodiment the temperature generated is below 1500° C.

In one embodiment the temperature generated is in the range of 930° C. and 1460° C.

In one embodiment the pulse length is above 25 nanoseconds.

In one embodiment the pulse length is between 50 nanoseconds and 1 microsecond.

In one embodiment the pulse length is between 50 nanoseconds and 500 nanoseconds.

According to an aspect of the present invention there is therefore provided a method of forming at least one Germanide ($Ni_xGe_y$) contact on a Germanium (Ge) substrate for providing a semiconducting device (100), comprising the steps of providing a first layer (120) of Germanium (Ge) with well and dopant implants; activating dopants with a heat treatment; providing a second layer of Nickel (Ni); and reacting the second layer with the first layer with high energy density pulses for obtaining a Germanide ($Ni_xGe_y$) layer (160A) having a substantially planar interface with the underlying first (Ge) layer.

Forming the NiGe layer using tuned laser anneal conditions advantageously forms a substantially flat interface between the NiGe layer and the Ge underneath. The laser anneal is a relatively short pulse of high energy density, which temporarily melts the top Ge surface of the wafer, while the Ni is unmelted. Ge melts ~936° C., while Ni melts ~1455° C. The surface temperature during the LTA process lies somewhere in that range. The solubility of Ni in Ge is vastly greater in the liquid Ge phase, compared to the solid Ge phase, and thus rapidly dissolves into that liquid layer. In effect the liquid Ge consumes the Ni on top very quickly. In comparison in the standard rap-id-thermal-anneal case Ni is in contact with solid Ge and there is a slower solid-solid reaction Moreover, the penetration depth of the laser pulse is limited whereby, advantageously, the heat travels only a certain distance from the top of the wafer downwards, contrarily to a conventional furnace-based or RTA-based method in which the entire wafer experiences the temperature within a tool chamber. Furthermore the energy density of the laser anneal process can tailor the melt depth at the Ge surface, and thus control the thickness of the nickel-germanide layer that is formed. There are many ways to thermally treat semiconductors, however laser thermal annealing provides a very localised treatment, both in terms of time (ns) and in terms of location on the substrate, i.e. typically just the surface layers are treated. It is envisaged that other thermal anneal techniques can be used.

In an embodiment of the method according to the invention, the first layer is a n-type wafer (100) having a resistivity exceeding 40 Ω·cm.

In an embodiment of the method according to the invention, the step of providing the second layer of Nickel (Ni) further comprises depositing the Nickel (Ni) material by thermal evaporation.

In an embodiment of the method according to the invention, the method may comprise the further step of TLM patterning and dry etching for minimizing leakage currents.

In an embodiment of the method according to the invention, the high energy density pulses are provided by a laser source in a laser thermal annealing (LTA) treatment. In a variant of this embodiment, the LTA treatment is a single-pulse treatment at λ=308 nm, with laser densities in the range 0.25 to 0.55 J/cm² and pulse durations in the range 144 to 165 ns. In a further variant of this embodiment, laser densities are preferably in the range 0.35 to 0.45 J/cm². The laser beam preferably has an area of substantially 10×10 mm². It will be appreciated that other wavelengths can be used, for example using an Excimer laser According to another aspect of the present invention, there is also provided a semiconductor device (100) comprising at least one n-channel transistor, wherein the or each n-channel transistor comprises a semiconductor region (120) comprised of germanium (Ge); a gate electrode (110) formed on the semiconductor region via a gate insulation film (140); and junction regions (160) formed in the semiconductor region on both sides of the gate electrode, wherein each region is made of nickel (Ni) reacted with the semiconductor region (Ge). The device is characterised in that the nickel (Ni) is reacted with the germanium (Ge) region with high energy density pulses, whereby each region ($Ni_xGe_y$) has a substantially planar interface with the underlying semiconductor region (120).

In an embodiment of the device according to the invention, the semiconductor region is a n-type wafer (100) having a resistivity exceeding 40 Ω·cm.

In an embodiment of the device according to the invention, the high energy density pulses are provided by a laser source in a laser thermal annealing (LTA) treatment. In a variant of this embodiment, the LTA treatment is a single-pulse treatment at λ=308 nm, with laser densities in the range 0.25 to 0.55 J/cm² and pulse durations in the range 144 to 165 ns. In a further variant of this embodiment, the laser densities are preferably in the range 0.35 to 0.45 J/cm². The laser beam preferably has an area of substantially 10×10 mm².

In one embodiment there is provided a method for forming metal germanide comprising
- depositing a metal layer on a germanium layer;
- heating the metal layer with a laser source;
- characterized in that the heating occurs at a temperature of at least 800° C.

In one embodiment the heating is pulsed.

In one embodiment the high energy density pulses are in the range 0.25 to 0.55 J/cm² and pulse durations generate a temperature of at least 800° C.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which.

DETAILED DESCRIPTION OF THE EMBODIMENTS

There will now be described by way of example a specific mode contemplated by the inventors. In the following description numerous specific details are set forth in order to provide a thorough understanding. It will be apparent however, to one skilled in the art, that the present invention may be practiced without limitation to these specific details. In other instances, well known methods and structures have not been described in detail so as not to unnecessarily obscure the description.

Laser Thermal Annealing (LTA) is used to form Germanide contacts on n-doped Ge, which are systematically compared to results generated by conventional rapid thermal annealing (RTA). Surface topography, interface quality, crystal structure, and material stoichiometry are explored for both annealing techniques. For electrical characterization, specific contact resistivity and thermal stability are extracted. It is shown that LTA can produce a uniform contact with a remarkably smooth substrate interface, with specific contact resistivity 2 to 3 orders of magnitude lower than with the RTA technique. It is shown that a specific contact resistivity of $2.84 \times 10^{-7}$ Ω·cm² is achieved for optimized LTA energy density conditions.

Figure 1:
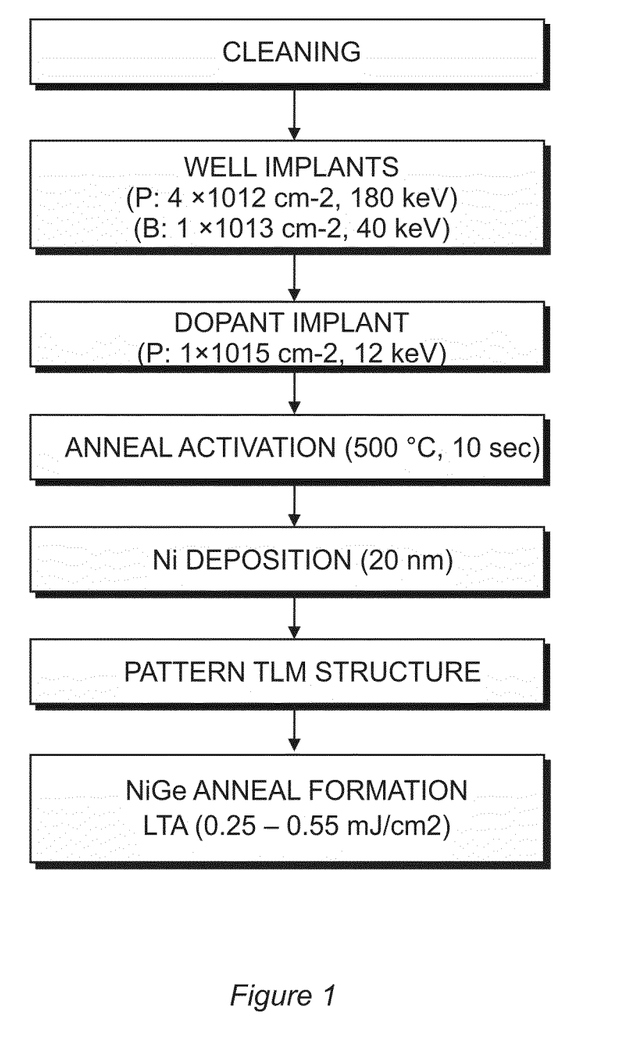
FIG. 1 shows procedural steps of a first embodiment of a method according to the invention, the testing of which has yielded the respective subject-matter of each of remaining FIGS. 2 to 10.

FIG. 1 summarizes the process undertaken, from which the following results are discussed in this study. After cleaning, high-resistivity (>40 Ω·cm) n-type (100) wafers received well implants, namely P with the dose of $4 \times 10^{12}$ cm⁻² and energy of 180 keV, followed by a B implant with the dose of $1 \times 10^{13}$ cm⁻² and energy of 40 keV to create a semi-insulating layer. The wafers then received a shallow P implant with the dose of $1 \times 10^{15}$ cm⁻² and energy of 12 keV. Dopant activation was performed using an RTA at 500° C. for 10 seconds in an $N_2$ ambient. Thereafter 20 nm of Ni was deposited using thermal evaporation. TLM patterning and dry etch was then carried out to minimize leakage currents. Nickel is described herein to illustrate operation of the invention, it will be appreciated that other metals can be used such as Fe, Co, Ni, Pd, Pt, Cu or Yb.

One set of samples received RTA treatment at either 250, 275, 300, 325 or 350° C. in $N_2$ for 30 seconds. Another set of samples received LTA processing (λ=308 nm, single-pulse) with laser densities ranging from 0.25 to 0.55 J/cm² and time durations ranging from 144 to 165 ns. The laser beam area was approximately 10×10 mm². It is noted that these energy densities are significantly lower than those required for proper LTA assisted dopant activation in Ge [8].

Various material characterization techniques were applied to inspect NiGe layer surface topography and crystalline quality, including scanning electron microscopy (SEM), atomic force microscopy (AFM), x-ray diffraction (XRD), and cross-sectional transmission electron microscopy (XTEM). XTEM was carried out using the JEOL 2100 high-resolution TEM. In particular, AFM shows smoother surface layer, and cross-sectional TEM shows a sharp, non-undulating interface after LTA. For electrical characterization, the Transfer Length Method (TLM) was used to extract $\rho_c$ and the KEITHLEY 37100 and KEITHLEY 2602 were used. In particular, contact resistance is determined as approximately 100 times lower using LTA, relative to RTA.

Figure 2:
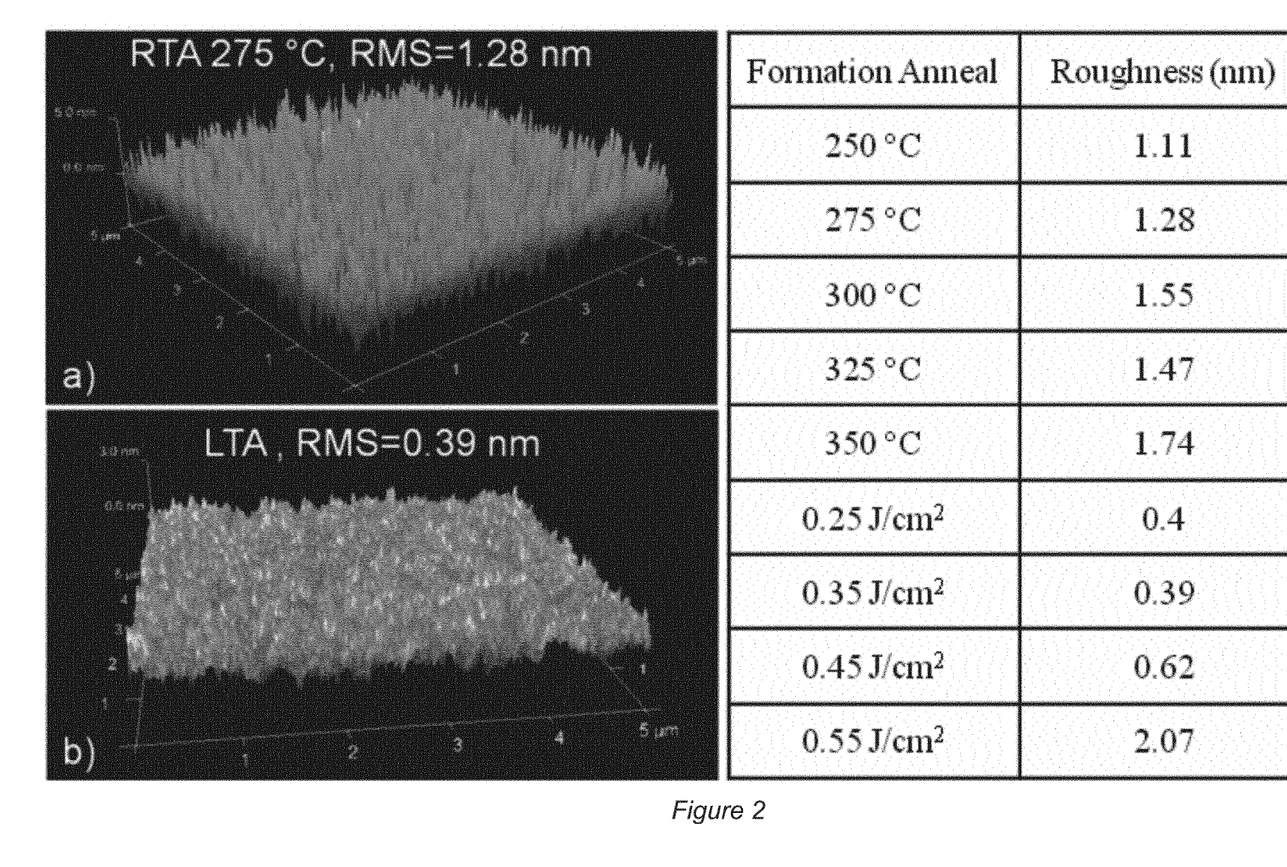
FIG. 2 shows AFM images of Germanide layers respectively formed by (a) RTA conventionally and by (b) LTA according to the method of FIG. 1, and wherein a table shows surface roughness data for RTA and LTA samples.

In order to study the respective effects of RTA and LTA, firstly surface roughness was evaluated. AFM was performed in tapping/non contact mode at room temperature in air. FIG. 2 shows representative AFM images of NiGe surface topography which were formed by (a) RTA at 275° C. and (b) LTA at the energy of 0.35 J/cm². Surface roughness (RMS) for the RTA sample is approximately 1.28 nm whereas the LTA treated sample exhibits a roughness of approximately 0.39 nm. The table in FIG. 2 shows the RMS data extracted for all the samples. RMS is larger for the RTA set, except for the highest energy density LTA.

Much like there is a process window for NiGe formation by RTA [11, 12] where, at high temperatures, the thin film agglomerates into islands, this data indicates that LTA also has a process window for $Ni_xGe_y$ formation, above which the film degrades. 0.55 J/cm² appears too elevated a value for this application. Mazzocchi et al. also reported a change in AFM RMS versus energy density in their LTA dopant activation study in Ge, which was attributed to the transition from non-melt, to sub-melt, to melt conditions [8]. From FIG. 2 therefore, it can be concluded that $Ni_xGe_y$ layers formed by LTA, at an energy density of 0.25 to 0.45 J/cm², are much smoother that those formed by RTA.

Figure 3A:
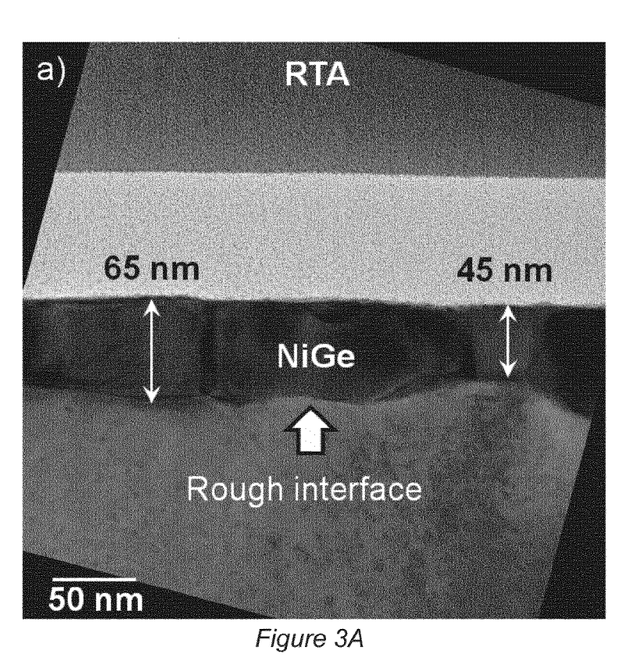
FIG. 3A shows a XTEM image of a NiGe layer conventionally formed by RTA at 350° C.
Figure 3B:
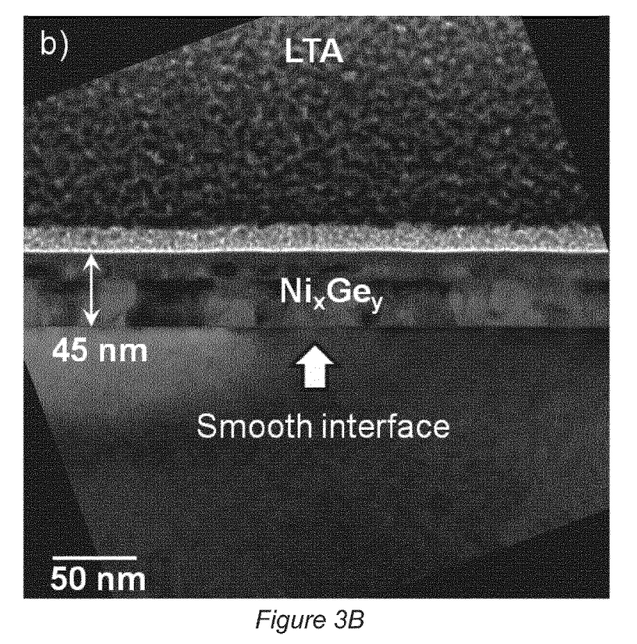
FIG. 3B shows a XTEM image of a $Ni_xGe_y$ layer formed by 0.35 J/cm² LTA according to the method of FIG. 1, having a smoother Ge-substrate interface relative to the interface of FIG. 3A.

A representative XTEM image from a Germanide contact formed by RTA at 350° C. for 30 seconds in $N_2$ is shown in FIG. 3A. As seen in the figure, large grains of NiGe are formed, with a rough undulating interface between the alloy and the Ge substrate. This result is expected, as non-smooth NiGe interfaces are commonplace when RTA is used for the formation anneal [5, 7, 13]. With comparative reference to FIG. 3B now, the representative XTEM image of a sample treated by LTA, in this case with an energy density of 0.35 J/cm² stands in stark contrast, as LTA results in smaller polycrystalline grains of Germanide and a very a flat interface between the Ge substrate and the alloy.

Figure 4A:
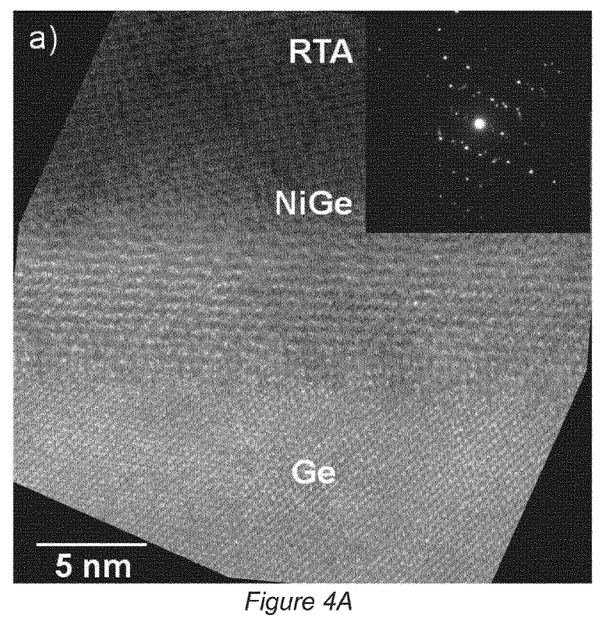
FIG. 4A shows both a HRXTEM image of the interface between the Ge and the NiGe after the RTA of FIG. 3A, having a substantial transition region, and an inset image showing the diffraction patterns from Ge and NiGe.

A representative high-resolution (HR) XTEM image of the Germanide-substrate interface in the sample of FIG. 3A is next shown in FIG. 4A. As seen in the figure, there is no sharp transition from Ge to NiGe. With comparative reference to FIG. 4B now, the representative (HR) XTEM image of a sample treated by LTA, in this case with an energy density of 0.35 J/cm² stands in stark contrast, showing a flat and uniform interface between Ge and the Germanide.

The rows of Ge atoms are clearly observable in the substrate. In terms of the interface quality, the interface is substantially planar and the term "atomically-flat" may be used, because there are unbroken horizontal rows in the Ge (100) substrate transitioning immediately to Germanide above it, without any detectable interfacial region or transition zone. Furthermore, the evidence of (HR) TEM indicates that this Germanide layer is not necessarily lattice matched, nor epitaxially grown on top of the Ge substrate. If one follows any row of Ge substrate atoms diagonally upwards in FIG. 4B, this sequence does not continue into the Germanide layer. The rows of atoms in the Germanide layers are arranged in different directions to those in the (100) Ge substrate. In some regions of the Ge substrate-germanide interface the is evidence of an epitaxial relationship between the two crystalline materials, but this is highly localised to certain places along the horizontal interface. Furthermore due to lattice mismatch between the two materials and the small size of crystals in the germanide layer, this does not extend vertically throughout the entire germanide layer. Lattice-matched NiSi growth on Si has been reported by Gao et al., where ultra-thin Ni layers were deposited on Si [14], and $NiSi_2$ preferentially formed as it has a similar lattice spacing to Si.

Figure 4B:
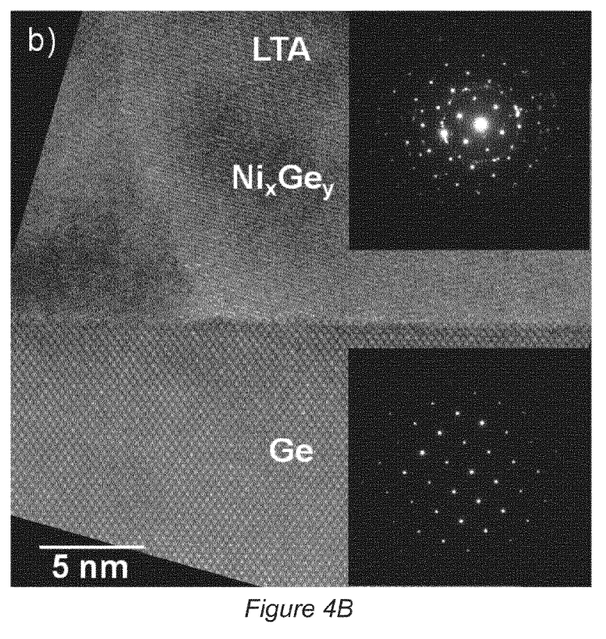
FIG. 4B shows both a HRXTEM image of the interface between the Ge and the $Ni_xGe_y$, after the LTA of FIG. 3B, having a substantially sharper interface, and an inset image showing the diffraction patterns from Ge and $Ni_xGe_y$.

The dramatic improvement in interface roughness is linked to the thermal gradient and shallow heat distribution associated with ultra-short-pulse LTA. Unlike RTA, wherein substantially the entire sample is at the target temperature without significant thermal gradients, LTA generates intense thermal gradients, linked to the wavelength of the incident energy pulse, and the thermal diffusivity of the target material. The LTA pulse heats the surface locally, and may melt the surface layers depending on the energy density applied. The two inset pictures in FIG. 4B show the electron diffraction pattern of Ge substrate (bottom right) and the $Ni_xGe_y$ (top right).

Figure 5:
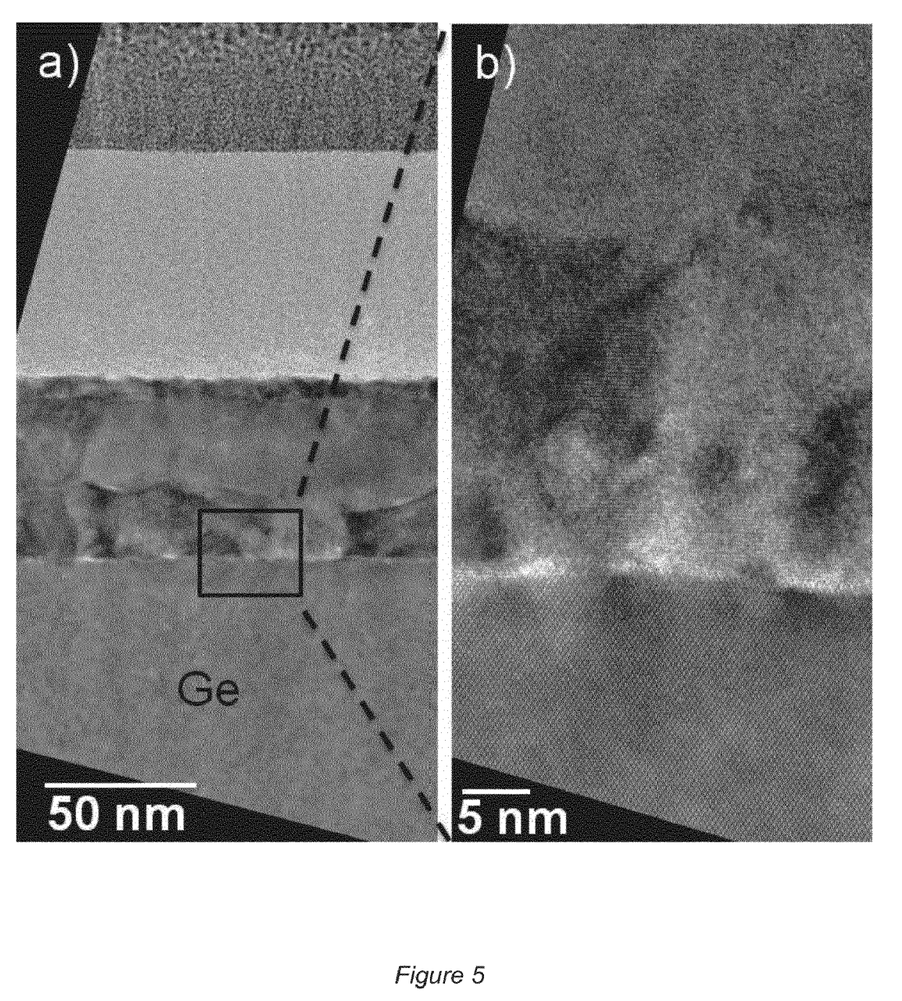
FIG. 5 shows representative XTEM images of the $Ni_xGe_y$-substrate layer and the interface between the Ge and the $Ni_xGe_y$, where a high energy density of substantially 0.55 J/cm² LTA was applied, and wherein larger grains can be seen in the $Ni_xGe_y$ layer, and the interface is not as sharp as in FIGS. 3B and 4B.

With reference to FIG. 5 next, XTEM images are presented for LTA at a high energy density of 0.55 J/cm². The left section (a) of FIG. 5 is a wide view, and the right section (b) is a high resolution view, of Ge and the contact interface. In this case, larger grains of Germanide are formed and the interface is coarser relative to those observable in FIGS. 3B and 4B.

Turning now to electrical characterisation, using the fabricated TLM test structures, $\rho_c$ of the germanide/n-type Ge interface and the sheet resistance $R_{sh}$ of the underlying P doped Ge layer were then extracted. In the TLM test structure, each NiGe bar was 380×100 μm² and the spacings were 4, 16, 36, 64, 100, 144, and 196 μm. The layout consisted of a repeated array of this TLM design. Approximately 40 TLM structures within each array were electrically measured in order to extract reliable values for $\rho_c$ and $R_{sh}$.

Figure 6:
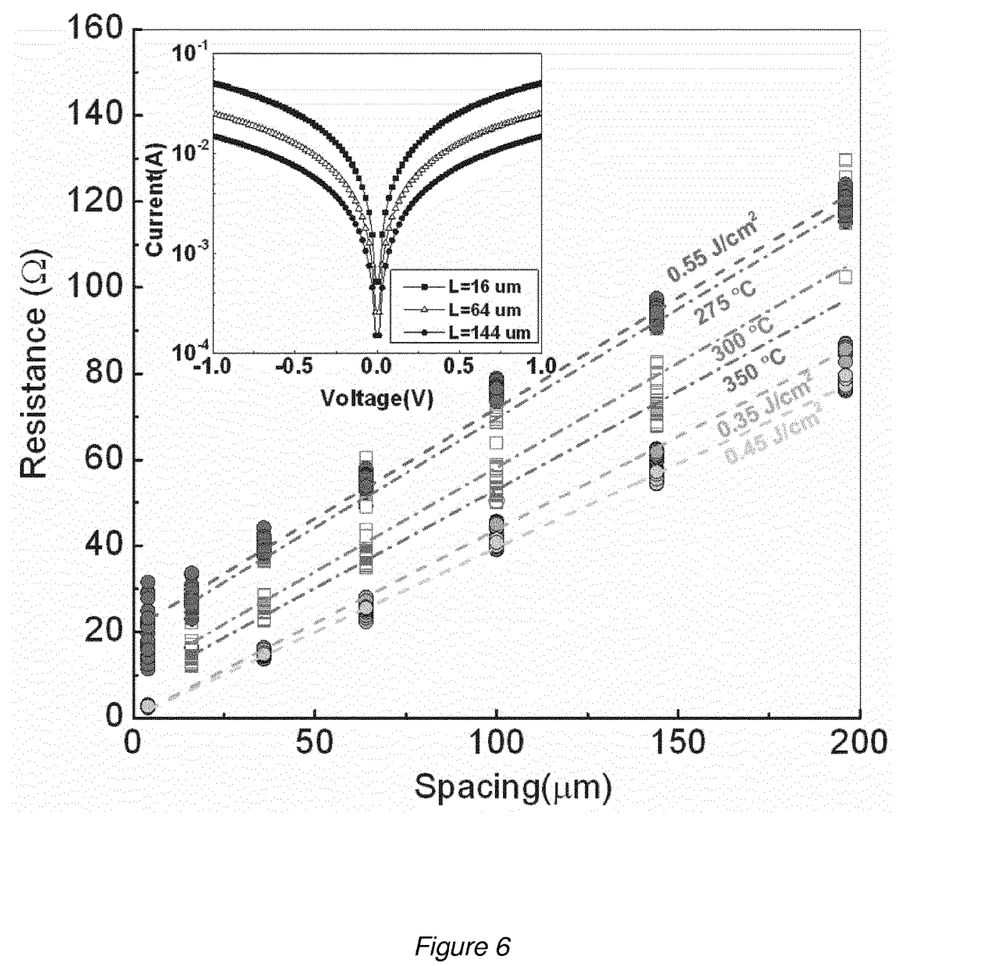
FIG. 6 charts resistance versus contact spacing for both conventional RTA samples and LTA samples according to the method of FIG. 1, wherein the inset graph shows I-V characteristics of a typical TLM structure in which $Ni_xGe_y$ contacts are formed by LTA at an energy of 0.45 J/cm².

FIG. 6 shows the output from a TLM measurement in the above context. The inset shows current versus voltage as a function of contact spacing of a typical TLM structure fabricated using LTA (0.45 J/cm²). The resistance between contacts increases as the spacing increases. In the main part of FIG. 6, resistance versus contact spacing is plotted for the NiGe formed by RTA at 275°, 300°, 350° C. and LTA at 0.35, 0.45, and 0.55 J/cm². Straight lines are fitted to the data. Intercepts of the line with vertical and horizontal axes are used to calculate $\rho_c$ and $R_{sh}$ according to theory [3]. The following table shows the results of $\rho_c$ and $R_{sh}$ extracted from all the TLM measurements.

| Contact formation | $R_{sh}$ (Ω/sq) | $\rho_c$ (Ω · cm²) |
|---|---|---|
| 275° C. | 196.1 | $6.31 \times 10^{-4}$ |
| 300° C. | 186.0 | $1.61 \times 10^{-4}$ |
| 325° C. | 216.3 | $9.57 \times 10^{-4}$ |
| 350° C. | 161.3 | $1.35 \times 10^{-4}$ |
| 0.35 J/cm² | 163.6 | $1.33 \times 10^{-6}$ |
| 0.45 J/cm² | 147.0 | $2.84 \times 10^{-7}$ |
| 0.55 J/cm² | 190.7 | $8.45 \times 10^{-4}$ |

In the RTA samples, $R_{sh}$ and $\rho_c$ decrease as the formation temperature increases from 275 to 350° C., except at 325° C. for which there is currently no physical explanation. In an overall sense, the RTA samples produce $\rho_c > 10^{-4}$ Ω·cm². In general, $R_{sh}$ and $\rho_c$ are lower in the LTA samples. The best $\rho_c$ value is $2.84 \times 10^{-7}$ Ω·cm² obtained for the TLM sample LTA-annealed at 0.45 J/cm², and $\rho_c = 1.33 \times 10^{-6}$ Ω·cm² obtained for the TLM sample LTA-annealed at 0.35 J/cm² is also a significant result. These $\rho_c$ values are 2 to 3 orders of magnitude lower than the equivalent RTA cases. It should be noted that the only process variable in this experimental work was the NiGe formation anneal, and it is interesting to see that increasing the LTA energy density to 0.55 J/cm² results in higher $\rho_c$, which may be attributed to the degradation of the interface quality seen as shown in FIG. 5.

Figure 7:
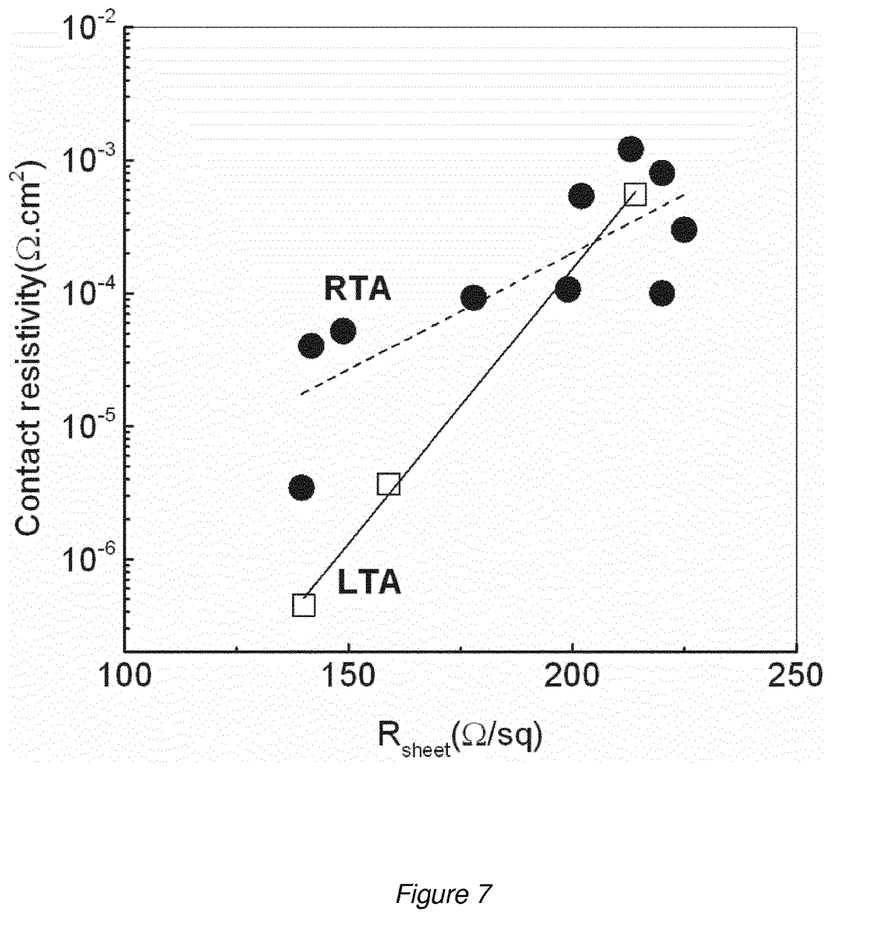
FIG. 7 charts $\rho_c$ versus $R_{sh}$ for a plurality of samples, including NiGe on n-type Ge using RTA, which shows that, for a fixed $R_{sh}$, LTA can produce better $\rho_c$, if a correct energy density condition is selected.

It is well-known that $\rho_c$ is a strong function of active doping in the substrate below the contact, thus any boost in dopant activation will yield a similar improvement in $\rho_c$. With reference to the above results the 0.35 and 0.45 J/cm² LTA, it may be argued that the LTA is merely improving the P activation which is generating these $\rho_c$ results. From the above table, the $R_{sh}$ values suggest that LTA is a benefit for P activation. However, with reference now to FIG. 7, plotting $\rho_c$ versus $R_{sh}$ shows that, for a fixed $R_{sh}$, LTA can still produce better $\rho_c$, if the correct energy density condition is selected.

Figure 8:
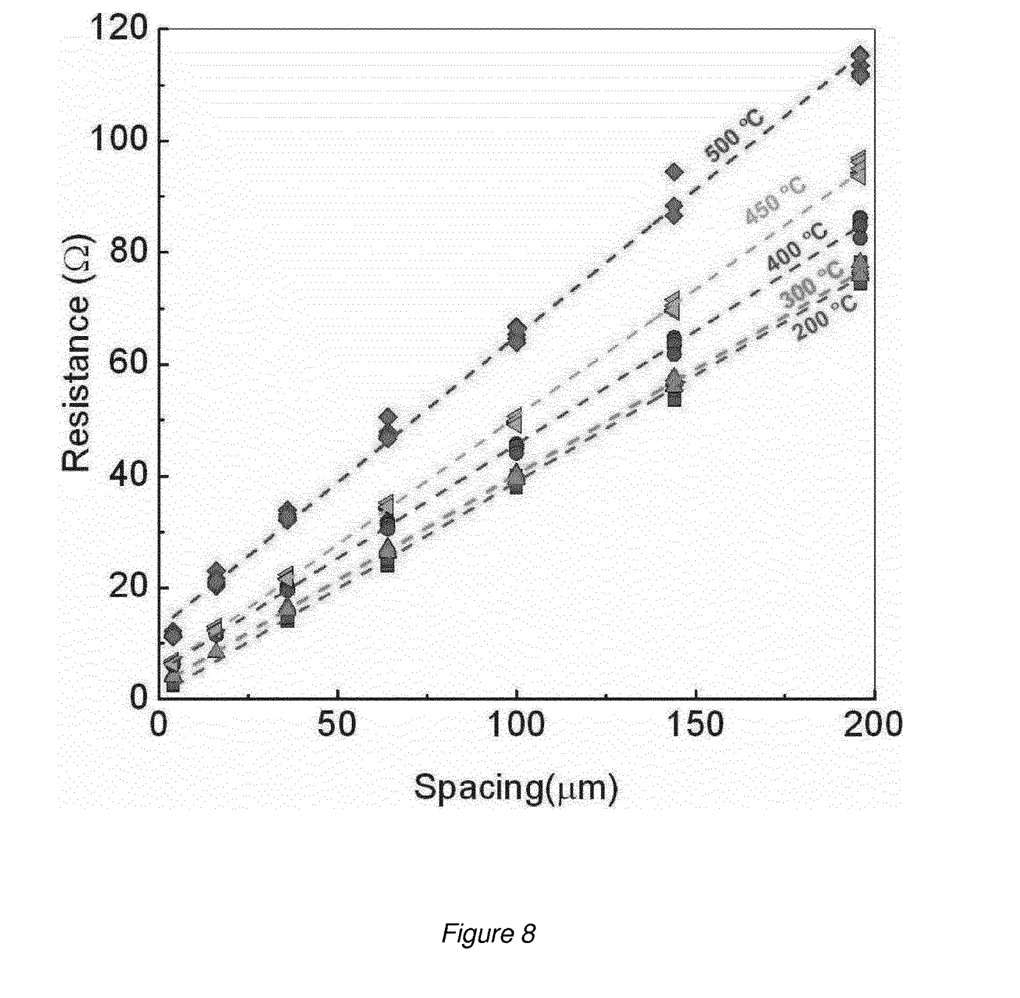
FIG. 8 charts resistance versus contact spacing after post-processing RTA treatments for which anneal times were 30 seconds. Germanide contact was initially formed by LTA with energy of 0.45 J/cm².

Thermal stability of the $Ni_xGe_y$ layers was also analysed. The ultra-short time and highly-localized energy densities of LTA processing may form highly non-equilibrium metastable conditions in the semiconductor materials and substrates. In such a case, the thermal budget in the processes which follow the LTA process step, may cause any metastable condition to revert back to a more equilibrium state. In order to evaluate Germanide thermal stability, a sample prepared at 300° C. RTA and a sample prepared by 0.45 J/cm² LTA were subjected to "post-processing" RTA treatments from 100 to 500° C. The anneal times were 30 seconds each. Only one sample was post-processed for both RTA and LTA, whereby the post-processing thermal-budget should be considered as cumulative in this analysis. FIG. 8 provides TLM measurements of the LTA sample after post-processing RTA steps, which show that the slope and intercept of the fitted lines are changing after each RTA treatment, indicating that $R_{sh}$ and $\rho_c$ are deteriorated. Some TLM measurements are not shown in FIG. 8, however, for purposes of not obscuring the Figure unnecessarily.

Figure 9:
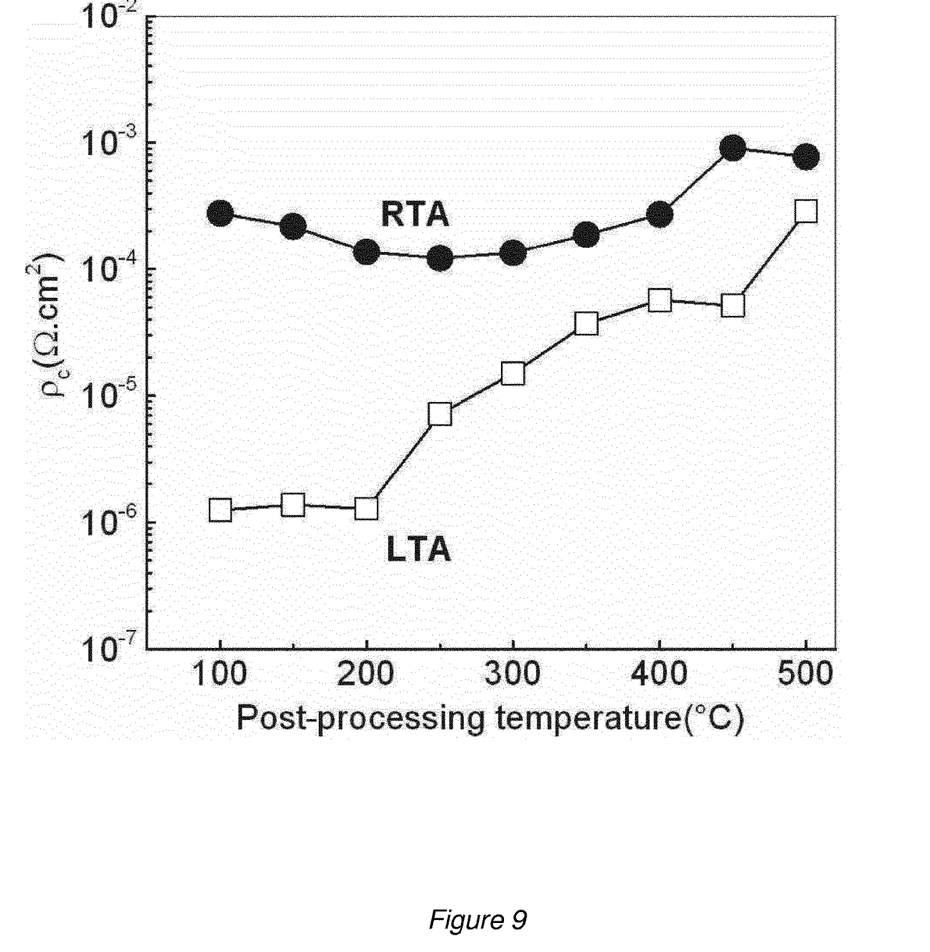
FIG. 9 charts $\rho_c$ versus post-processing RTA treatments, in which only one sample was post-processed for RTA and for LTA, whereby the post-processing thermal-budget should be considered as cumulative.

Extracted $\rho_c$ results are shown in FIG. 9. In the LTA sample, $\rho_c$ increases gradually, and at 250° C. there is a significant increase in resistivity. By 500° C., the $\rho_c$ value is similar to the RTA cases. In the RTA sample, $\rho_c$ shows a slight decrease at 150° C., then follows an increasing trend. Both samples were inspected by SEM (data not shown), and it was observed at the end of this post-processing anneal sequence that the Germanide had agglomerated. It is well known that NiGe layers annealed at 500° C. become agglomerated [11, 12].

There are various known methods for altering thermal stability of Silicide or Germanide layers. One recent report highlighted the benefit of cosputtering Ni and Pt prior to alloy formation [14]. In that reference, the addition of Pt improved the thermal stability of $R_{sh}$ in the Germanide layers, and alternative embodiments of the present method may therefore include the addition of Pt to achieve the same benefit.

The present invention thus provides an improved method of forming Germanide ($Ni_xGe_y$) contacts on n-type Germanium (Ge) substrates for use with semiconducting devices, with a substantially planar, or regular, interface relative to the rough, uneven interface of prior art techniques. The quality of Germanide contacts formed by state-of-the-art LTA on n-type Ge was investigated and compared systematically with conventional RTA. LTA resulted in smoother layers, smaller polycrystalline grains, and greater content of Ni-rich Germanide phases. The Germanide-substrate interface was dramatically sharpened without any detectable interfacial region or transition zone in HRXTEM. $\rho_c$ of the contacts was also extracted from TLM structures. The best contact resistivity obtained was $2.84 \times 10^{-7}$ $\Omega \cdot cm^2$ using a $1 \times 10^{15}$ $cm^{-2}$ 12 keV P implant followed by 500° C. 10-second activation anneal and LTA of 0.45 $J/cm^2$ energy density for Germanide formation.

Figure 10:
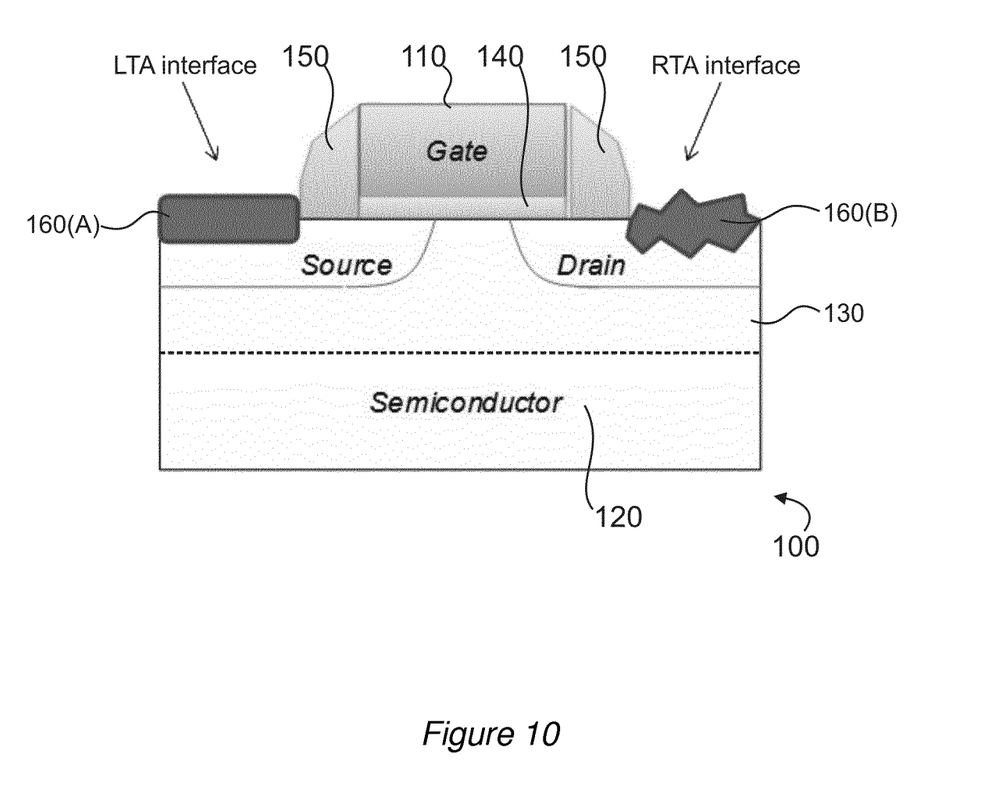
FIG. 10 shows a semiconductor device according to one embodiment of the invention.

It will therefore be readily understood by the skilled reader that the LTA annealing technique disclosed herein is particularly advantageous for any semiconductor device having a Ge or GaAs component such as, typically, but non-exhaustively, CMOS devices, photodiodes and imagers. With reference to FIG. 10, a semiconductor device 100 is shown by way of example, with which the invention may be practiced. The semiconductor device 100 has a gate electrode 110 formed over a Ge substrate 120, having an n- or p-well 130 with a gate insulating film 140 formed between the well and the gate. A sidewall 150 is formed about the gate insulting film 140 and the gate electrode 110. An $Ni_xGe_y$ layer 160 is formed on both sides of the gate electrode 110 as respective junctions, on the sides of which the sidewall 150 is formed and, in the Figure and by way of illustration only, the left layer 160A is an $Ni_xGe_y$ layer formed by LTA according to the invention, and the right layer 160B is an NiGe layer formed by RTA according to the prior art.

It will be appreciated that use of any of the above methods can be employed in manufacturing germanium or III-IV semiconductor devices, such as transistor devices.

It will be appreciated that use of any of the above methods can be employed in manufacturing of contact structures of germanium or III-IV semiconductor devices.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

REFERENCES

[1] A. Dimoulas, P. Tsipas, A. Sotiropoulos, and E. K. Evangelou, "Fermi-level pinning and charge neutrality level in germanium," *Applied Physics Letters*, vol. 89, p. 252110, 2006.

[2] Y. Zhou, W. Han, Y. Wang, F. Xiu, J. Zou, R. Kawakami, and K. L. Wang, "Investigating the origin of Fermi level pinning in Ge Schottky junctions using epitaxially grown ultrathin MgO films," *Applied Physics Letters*, vol. 96, p. 102103, 2010.

[3] M. Shayesteh, C. L. L. M. Daunt, D. O'Connell, V. Djara, M. White, B. Long, and R. Duffy, "NiGe Contacts and Junction Architectures for P and As Doped Germanium Devices," *Electron Devices, IEEE Transactions on*, vol. 58, pp. 3801-3807, 2011.

[4] A. M. Roy, J. Lin, and K. C. Saraswat, "The Effect of Fixed Charge in Tunnel-Barrier Contacts for Fermi-Level Depinning in Germanium," *Electron Device Letters, IEEE*, vol. 33, pp. 761-763, 2012.

[5] T. Yi, L. Bin, P. S. Y. Lim, and Y. Yee-Chia, "Selenium Segregation for Effective Schottky Barrier Height Reduction in NiGe/n-Ge Contacts," *Electron Device Letters, IEEE*, vol. 33, pp. 773-775, 2012.

[6] J.-R. Wu, Y.-H. Wu, C.-Y. Hou, M.-L. Wu, C.-C. Lin, and L.-L. Chen, "Impact of fluorine treatment on Fermi level depinning for metal/germanium Schottky junctions," *Applied Physics Letters*, vol. 99, pp. 253504-3, 2011.

[7] K. Gallacher, P. Velha, D. J. Paul, I. MacLaren, M. Myronov, and D. R. Leadley, "Ohmic contacts to n-type germanium with low specific contact resistivity," *Applied Physics Letters*, vol. 100, pp. 022113-3, 2012.

[8] V. Mazzocchi, C. Sabatier, M. Py, K. Huet, C. Boniface, J. P. Barnes, L. Hutin, V. Delayer, D. Morel, M. Vinet, C. Le Royer, J. Venturini, and K. Yckache, "Boron and Phosphorus dopant activation in Germanium using laser annealing with and without preamorphization implant," in *Advanced Thermal Processing of Semiconductors, 2009. RTP '09. 17th International Conference on*, 2009, pp. 1-5.

[9] G. Thareja, J. Liang, S. Chopra, B. Adams, N. Patil, S. L. Cheng, A. Nainani, E. Tasyurek, Y. Kim, S. Moffatt, R. Brennan, J. McVittie, T. Kamins, K. Saraswat, and Y. Nishi, "High performance germanium n-MOSFET with antimony dopant activation beyond 1×1020 cm-3," in *Electron Devices Meeting (IEDM), 2010 IEEE International*, 2010, pp. 10.5.1-10.5.4.

[10] A. Firrincieli, K. Martens, R. Rooyackers, B. Vincent, E. Rosseel, E. Simoen, J. Geypen, H. Bender, C. Claeys, and J. A. Kittl, "Study of ohmic contacts to n-type Ge: Snowplow and laser activation," *Applied Physics Letters*, vol. 99, pp. 242104-3, 2011.

[11] K. Lee, S. Liew, S. Chua, D. Chi, H. Sun, and X. Pan, "Formation and Morphology Evolution of Nickel Germanides on Ge (100) Under Rapid Thermal Annealing," 2004, pp. 55-60.

[12] Q. Zhang, N. Wu, T. Osipowicz, L. K. Bera, and C. Zhu, "Formation and thermal stability of nickel germanide on germanium substrate," *JAPANESE JOURNAL OF APPLIED PHYSICS PART 2 LETTERS*, vol. 44, 2005.

[13] M. K. Husain, X. V. Li, and C. H. de Groot, "High-Quality Schottky Contacts for Limiting Leakage Currents in Ge-Based Schottky Barrier MOSFETs," *Electron Devices, IEEE Transactions on*, vol. 56, pp. 499-504, 2009.

[14] K. Min-Ho, S. Hong-Sik, Y. Jung-Ho, L. Ga-Won, O. Jung-Woo, P. Majhi, R. Jammy, and L. Hi-Deok, "Thermally Robust Ni Germanide Technology Using Cosputtering of Ni and Pt for High-Performance Nanoscale Ge MOSFETs," *Nanotechnology, IEEE Transactions on*, vol. 11, pp. 769-776, 2012.

The invention claimed is:

1. A method of forming at least one Metal Germanide contact on a substrate for providing a semiconducting device (100), comprising the steps of
providing a first layer (120) of Germanium (Ge);

providing a second layer of metal; and reacting the second layer with the first layer with high energy density pulses for obtaining a Germanide metal layer (160A) having a substantially planar interface with the underlying first (Ge) layer, wherein the high energy density pulses are in the range 0.25 to 0.55 J/cm2 and pulse durations generate a temperature of at least 800° C.

2. The method according to claim 1, wherein the metal comprises Nickel (Ni).

3. The method according to claim 1, wherein the metal comprises at least one of: Fe, Co, Ni, Pd, Pt, Cu or Yb.

4. The method according to claim 1 wherein the temperature generated is at least 900° C.

5. The method according to claim 1 wherein the temperature generated is below 1500° C.

6. The method according to claim 1 wherein the temperature generated is in the range of 930° C. and 1460° C.

7. The method according to claim 1 wherein the pulse length is above 25 nanoseconds.

8. The method according to claim 1 wherein the pulse length is between 50 nanoseconds and 1 microsecond.

9. The method according to claim 8 wherein the pulse length is between 50 nanoseconds and 500 nanoseconds.

10. The method according to claim 1 wherein the first layer is a n-type or p-type wafer (100) having a resistivity greater than 0.001 Ω·cm.

11. The method according to claim 2, wherein the step of providing the second layer of Nickel (Ni) further comprises depositing the Nickel (Ni) material by thermal evaporation.

12. The method according to claim 1, comprising the further step of TLM patterning and dry etching for minimizing leakage currents.

13. The method according to claim 1, wherein the high energy density pulses are provided by a laser source in a laser thermal annealing (LTA) treatment.

14. The method according to claim 13, wherein the LTA treatment is a single-pulse treatment at $\lambda=308$ nm, with pulse durations in the range 144 to 165 ns.

15. A semiconductor device manufactured according to the method of claim 1.

* * * * *